United States Patent [19]

Graziadei et al.

[11] Patent Number: 4,480,337
[45] Date of Patent: Oct. 30, 1984

[54] TRANSISTOR MIXER AND AMPLIFIER INPUT STAGE

[75] Inventors: Rinaldo Graziadei, Monza; Michelangelo Lorusso, Carbonara, both of Italy

[73] Assignee: SGS-ATES Componenti Elettronici S.p.A., Brianza, Italy

[21] Appl. No.: 416,708

[22] Filed: Sep. 10, 1982

[30] Foreign Application Priority Data

Sep. 16, 1981 [IT] Italy ............................. 23984 A/81

[51] Int. Cl.$^3$ ............................................. H04B 1/26
[52] U.S. Cl. .................................. 455/333; 455/253; 455/332; 332/43 B
[58] Field of Search ............... 455/249, 253, 326, 332, 455/333; 332/16 T, 43 B

[56] References Cited

U.S. PATENT DOCUMENTS

| 3,579,114 | 5/1971 | Kozawa | 455/253 |
| 4,058,771 | 11/1977 | Ohsawa et al. | 455/333 |
| 4,216,431 | 8/1980 | Shibata et al. | 455/326 |
| 4,268,916 | 5/1981 | Kusakabe | 455/326 |
| 4,313,221 | 1/1982 | Mattfeld | 455/333 |
| 4,344,188 | 8/1982 | Tanabe et al. | 455/326 |

OTHER PUBLICATIONS

IEEE Transactions on Consumer Electronics, vol. CE-26, Aug. 1980, pp. 271-281.

Primary Examiner—Jin F. Ng
Attorney, Agent, or Firm—Wenderoth, Lind & Ponack

[57] ABSTRACT

A transistor mixer and amplifier input stage which includes a mixer and a differential amplifier whose gain is controlled by a voltage generated by an AGC circuit. Two transistors, each having a resistor connected in series with its emitter, are connected between the inputs of the differential amplifier and the mixer. When the level of the input signal increases beyond a given level, the two transistors begin to conduct, thereby shunting the differential amplifier.

3 Claims, 2 Drawing Figures

TRANSISTOR MIXER AND AMPLIFIER INPUT STAGE

BACKGROUND OF THE INVENTION

The present invention refers to radio frequency signal receivers and, in particular, to a transistor mixer and amplifier input stage for such a receiver, which is adaptable to being implemented by an integrated circuit.

The dynamic range of a receiver input stage, i.e. the difference between the maximum and minimum input signal level that can be accepted without introducing appreciable distortion, is limited on the low side by the stage sensitivity, and limited on the high side by the finite range of linearity of the transfer characteristic of the stage itself.

To modify the input circuit stage in a simple way in order to increase its input dynamic range, various techniques have been explored, one of which is mentioned later in this text, and which makes possible a more linear stage response. Nevertheless, in each of such cases, the techniques result in the deterioration of other parameters, such as sensitivity, the passband, and the maximum gain; consequently, the signal to noise ratio for low input signal levels is deteriorated. It is also possible to resort to more elaborate techniques, as are described, for example, in the article entitled "AM-FM Car Radio for Tomorrow" by R. Graziadei and G. Seragnoli, published by IEEE Transactions on Consumer Electronics, Vol. CE-26, August 1980, pp. 271-281. These techniques however, require rather complex circuits which are relatively critical in their component values.

SUMMARY OF THE INVENTION

The object of the present invention is to develop an input stage for a radio frequency receiver which will have an extended dynamic range, will have outstanding sensitivity and gain characteristics, and whose circuitry is very simple.

This object is achieved by the input stage which is defined and characterized in the claims which conclude the present description.

BRIEF DESCRIPTION OF THE DRAWINGS

The invention will be best understood from the following detailed description of one of its forms of execution, given purely as an example, and therefore not to be considered as limiting in regards to the attached drawings, in which.

DESCRIPTION OF THE PREFERRED EMBODIMENT

Figure 1:
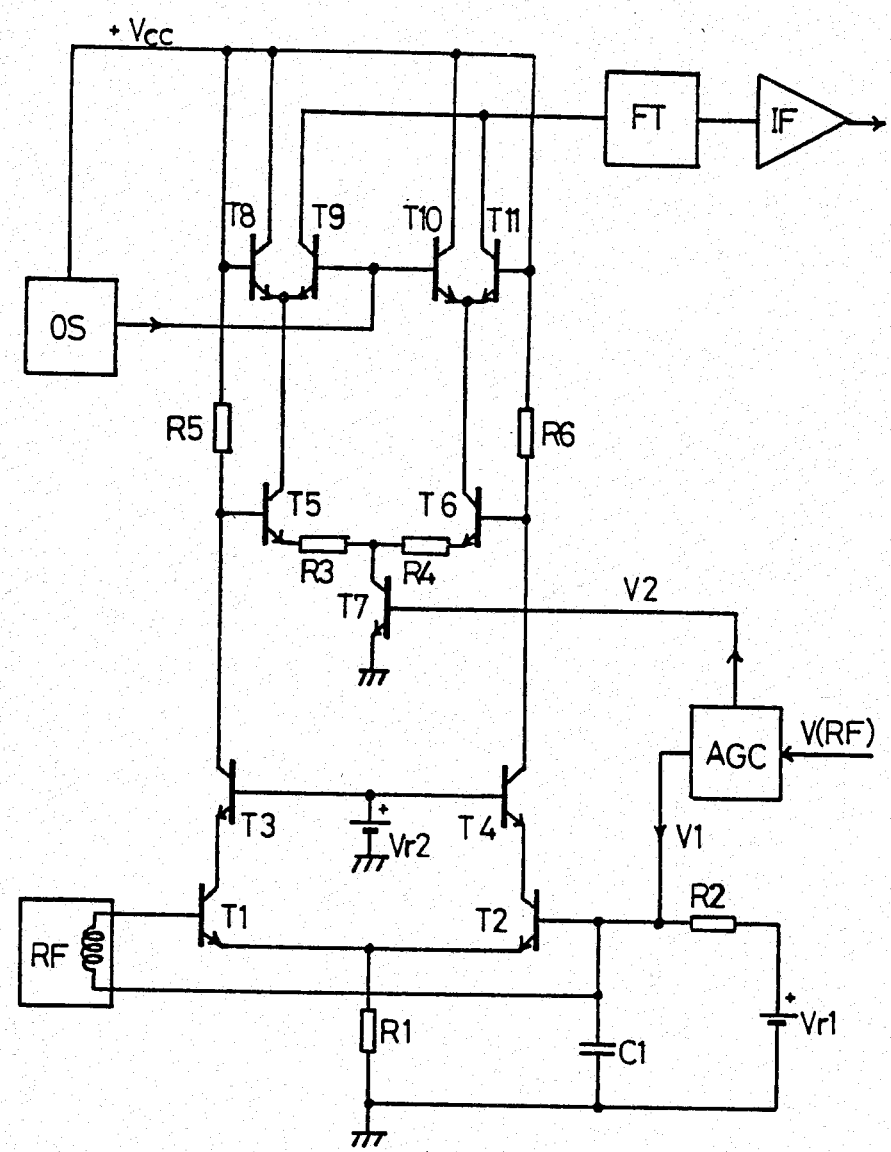
FIG. 1 illustrates a circuit diagram of a prior art input amplifier and mixer stage.

In examining the illustrations, in which the diagrams use the same letter references for their corresponding parts, and in particular, in FIG. 1, one can see that the input stage consists of a first differential amplifier, of the type known as a "cascode" differential amplifier, which is commonly used in broadband RF input stages. The stage is made up of two pairs of NPN transistors, T1 - T2 and T3 - T4. Transistors T1 - T2 of the first pair have their emitters connected together through a resistor R1 to the negative grounded terminal of a supply voltage source. Each of their bases are connected to a terminal of a source of radio frequency signals, for example, an aerial transformers, illustrated in FIG. 1 by a winding inside a block labeled RF. The base of transistor T2 is also connected to ground through a capacitor C1, which is a shortcircuit to the input signal, and the base of T2 is also connected through resistor R2, to a positive reference voltage source Vr1. The collectors of T1 and T2 are connected, respectively, to the emitters of transistors T2 and T4, whose bases are connected together to a positive reference voltage source Vr2. A second differential amplifier, which constitutes the input circuit of a double balanced mixer, comprises two NPN transistors, T5 and T6, which have their emitters connected, through series resistors R3 and R4 to the emitter of an NPN transistor T7, which has a grounded emitter, and which functions as a current generator. The bases of T5 and T6 are connected, respectively, to the collector of T3 and the collector of T4. Both of these are then connected to the positive terminal, +Vcc, of the supply source through resistors R5 and R6. The bases of transistors T2 and T7 are each connected to an output of a circuit, represented by block AGC, which generates a DC voltage whose value is dependent on the RF input signal level. In order to represent such a dependence, the input terminal of block AGC is indicated by V (RF) in FIG. 1.

Two pairs of identical NPN transistors, T8 - T9 and T10 - T11, are connected together in a way which forms, in combination with the second differential amplifier, a double balanced mixer. More particularly, the emitters of the T8 - T9 pair are connected together to the collector of T5, and the emitters of the T10 - T11 pair are connected together to the collector of T6. The input terminals of the second differential amplifier, in other words, the bases of transistors T5 and T6, constitute the two terminals of a first input to the mixer. The bases of T9 and T10, which are connected together, consitute a terminal of the second input to the mixer, which has as its second terminal the postive pole, +Vcc, of the supply source.

An oscillator, represented by a block OS in FIG. 1, whose frequency is variable in relation to the frequency of the signal tuned in the block RF (in a way which is well known to those skilled in the field and therefore not described although represented in the drawing figure), is connected to the second input of the mixer.

The base and collector of T8, the collector of T10, and the base of T11 are connected to the supply terminal, +Vcc. The collectors of T9 and T11 are joined to one another and these collectors constitute the output of the mixer and amplifier stage and are connected through a bandpass filter, FT, represented by block IF in FIG. 1.

The functioning of the above described circuit is well known to those skilled in the field, and therefore is only briefly described here. A radio frequency signal which is tuned in the RF block is amplified in the first differential amplifier circuit and is applied to the first input of the mixer. In the mixer, the radio frequency signal is further amplified and combined with the signal coming from the oscillator OS, which is applied to the second input of the same mixer. Consequently, a complex radio frequency signal exists at the output of the mixer, which has two components of a frequency equal to the sum and the difference between the frequency of the input signal and the frequency of the oscillator OS. Such a signal is suitably filtered through the FT filter, amplified in the intermediate frequency amplifier IF, and finally processed in other receiver circuits which are not represented in FIG. 1.

The gain of the first differential amplifier and that of the mixer differential amplifier are automatically controlled by the AGC circuit by two DC voltages, V1 and V2, having an amplitude which is proportional to the average level of the radio frequency input signal. These act upon, respectively, the first differential amplifier by modifying the bias of the bases of transistors T1 and T2, and the mixer differential amplifier by varying the conduction of T7 and therefore the current which it supplies to the circuit. More particularly, when the average level of the input signal increases, the voltage V1 and V2 diminish. Therefore, as can be easily ascertained, the emitter currents of the transistors of the two differential amplifiers are diminished, and their gain is also diminished.

It is known that when the input signal of a transistor operating as an amplifier in a common emitter configuration, such as transistors T1 and T2, is very broad, the amplifier's response begins to become non-linear, and therefore, the amplified signal is distorted. This effect can be minimized by a well-known method such as inserting a resistor in series with the emitter. However, this causes a reduction in the output and a worsening of the signal to noise ratio. Therefore, such a device cannot be used advantageously in a first amplifier stage of a radio frequency receiver, such as the first differential amplifier comprising transistors T1 and T2.

Figure 2:
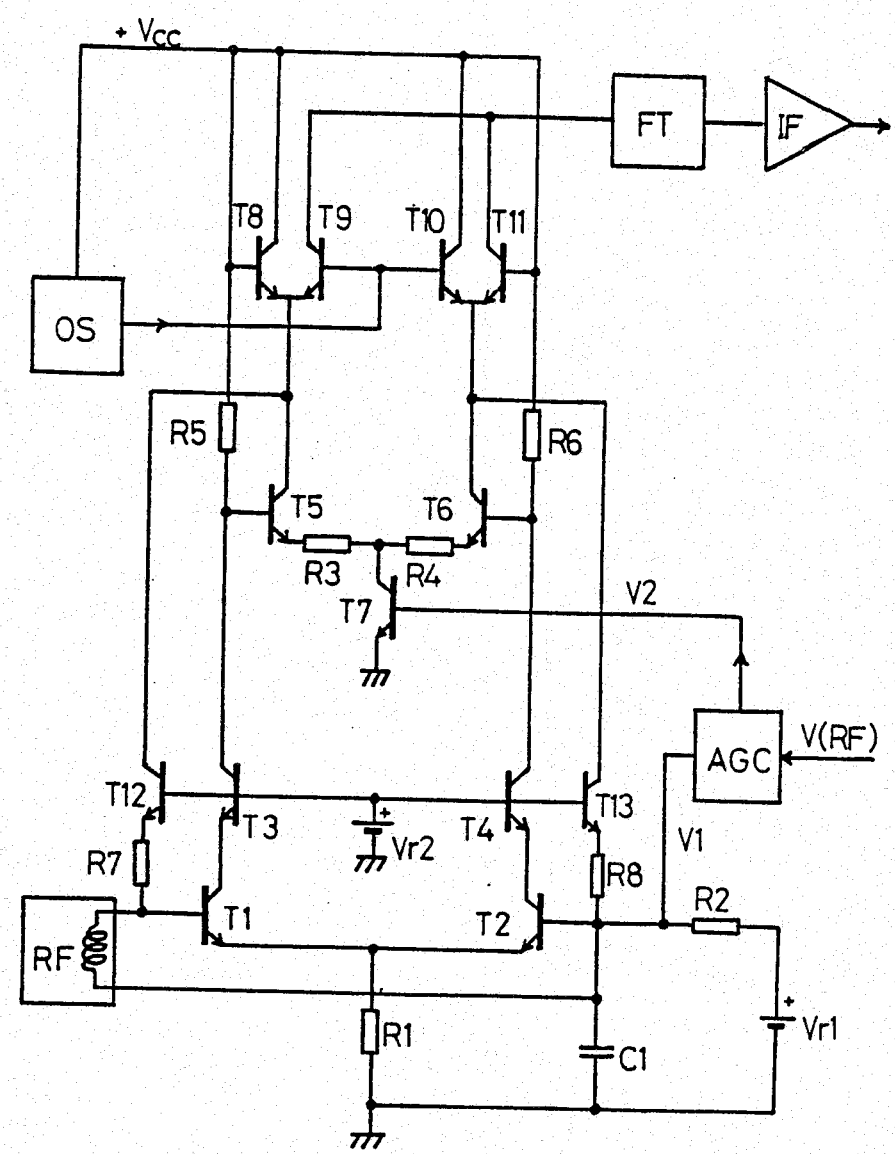
FIG. 2 illustrates the diagram of a circuit of the type represented in FIG. 1 which has been modified according to the present invention.

The functioning of a circuit of the type described in FIG. 1 is notably improved at high signal levels, according to the present invention, with the addition of a few components. As is shown in FIG. 2, such components are two NPN transistors T12 and T13, and two resistors R7 and R8. The transistors T12 and T13 have their bases connected in common to the bases of transistors T3 and T4, and their collectors connected, respectively, to the collectors of T5 and T6 and their emitters connected, respectively, to the bases of transistors T1 and T2 through resistors R7 and R8. The values of resistors R7 and R8 are calculated such that transistors T12 and T13 will not conduct until the voltage V1 supplied by the AGC circuit to the inputs of the first differential amplifier is large enough to guarantee a linear response of the same. When the average level of the input signal is high enough to cause a further reduction of the voltage V1 output by the AGC circuit, the transistors T12 and T13 begin to conduct, effectively connecting (i.e. shunting) the input and the output of the circuit formed by the connection of the first input differential amplifier to the differential amplifier of the mixer. The shunt effect increases as the level of the signal increases, while the gain of the differential amplifiers decreases until these are completely inactive and the signal is introduced in the mixer circuit by only the transistors T12 and T13.

It should be noted that the two transistors T12 and T13 are connected in a common base configuration and have therefore a current gain which is less than one, consequently constituting an attenuator for the input signal which can achieve very high levels without becoming distorted. In practice, such levels are limited by the bias conditions and in particular, by the reference voltages Vr1 and Vr2.

It can also be observed that the presence of resistors R7 and R8 does not hinder the signal to noise ratio of the input stage in that the intrinsically "noisy" path constituted by the shunt is not accessible to low signal levels when the low-noise first differential amplifier is in operation, but begins to function only when the input signal level is very high.

It should be noted, finally, that the realization of the invention represented in FIG. 2, expecially if realized with an integrated circuit, is particularly advantageous with respect to the economy of the components and connections, in that the same voltage source Vr2 is used to bias the shunt transistors T12 and T13, and transistors T3 and T4 of the first differential amplifier. And for the control of the operation of the same transistors, the same connection to the AGC circuit is used so as to control the gain of the first differential amplifier with the voltage V1.

Although only one form of realization of the invention has been described and illustrated, it is obvious that many variations and modifications may be derived without going beyond the scope of the invention.

For example, in place of the NPN transistors, PNP transistors could be used, and in place in one or more of the transistors which have been previously described as bipolar transistors, field effect transistors could be used.

We claim:

1. A transistor mixer and amplifier stage for a radio frequency receiver comprising:
   a voltage supply having two terminals;
   a differential amplifier connected between said voltage supply terminals having two differential input terminals, two differential output terminals and a gain control terminal;
   a radio frequency signal generator having two output terminals, said differential input terminals of said differential amplifier being respectively connected to said two output terminals of said radio frequency signal generator;
   a receiver control circuit having at least one output terminal, said gain control terminal of said differential amplifier being connected to said at least one output of said receiver control circuit which generates on at least one output terminal a voltage which is variable as a function of the average level of a radio frequency input signal so as to automatically control the gain of said differential amplifier;
   an oscillator having two output terminals and a mixer circuit of the double balanced type having a first input comprising two terminals respectively connected to said two differential output terminals of said differential amplifier, and having a second input comprising two terminals respectively connected to said two output terminals of said oscillator which is of a predetermined frequency and also having an output terminal which comprises an output of said stage; and
   an attenuator circuit having two substantially equal circuit branches, each of said branches being respectively connected between one of said input terminals of said differential amplifier and said first input of said mixer circuit, and having an enabling terminal connected to one of said at least one output terminal of said control circuit, said attenuator circuit being responsive to a voltage at one of said at least one output terminal of said control circuit so as to be gradually activated to attenuate signals flowing therethrough when an average level of said radio frequency input signal exceeds a preselected level.

2. An input stage according to claim 1, wherein said two output terminals of said radio frequency signal generator are a short-circuit for direct current; and
   wherein said gain control terminal corresponds to one of said input terminals of said differential amplifier; and
   wherein said mixer circuit comprises a differential input stage having a pair of differential output terminals; and
   wherein each of said two attentuator circuit branches respectively comprises a transistor, each of said transistors having their bases commonly connected to a constant voltage source, and having their emitters respectively connected, through separate resistors, to said input terminals of said differential amplifier and having their collectors respectively connected to one of said differential output terminals of said differential input stage of said mixer circuit.

3. An input stage according to claim 2, wherein said differential amplifier comprises two input transistors having their emitters commonly connected through separate resistors to one of said two supply voltage terminals and arranged such that their bases correspond to said differential input terminals of said differential amplifier and wherein said differential amplifier also comprises a pair of transistors arranged in a common base configuration, with their bases respectively commonly connected to said constant voltage source, and having their respective emitters connected to respective collectors of said two input transistors and arranged such that their collectors correspond to said two differential output terminals of said differential amplifier.

* * * * *